United States Patent
Le Cabec

(10) Patent No.: US 10,879,691 B2
(45) Date of Patent: Dec. 29, 2020

(54) UNLOCKABLE SWITCH INHIBITOR

(71) Applicant: VEONEER US INC., Southfield, MI (US)

(72) Inventor: Thierry Le Cabec, Lormaison (FR)

(73) Assignee: VEONEER US INC., Southfield, MI (US)

( * ) Notice: Subject to any disclaimer, the term of this patent is extended or adjusted under 35 U.S.C. 154(b) by 312 days.

(21) Appl. No.: 15/936,959

(22) Filed: Mar. 27, 2018

(65) Prior Publication Data
US 2019/0305546 A1 Oct. 3, 2019

(51) Int. Cl.
| | | |
|---|---|---|
| H02H 7/20 | (2006.01) | |
| H02H 9/04 | (2006.01) | |
| H03K 17/567 | (2006.01) | |
| B60R 16/03 | (2006.01) | |
| H02M 3/07 | (2006.01) | |

(52) U.S. Cl.
CPC .............. H02H 7/20 (2013.01); B60R 16/03 (2013.01); H02H 9/04 (2013.01); H02M 3/07 (2013.01); H03K 17/567 (2013.01)

(58) Field of Classification Search
CPC ............ H02H 7/10; H02H 7/12; H02H 12/13; H02H 7/20; H02H 7/205; H02H 9/04; H02H 9/041; H02H 9/042; H02H 9/043; H02H 11/002; H02H 11/003; H03K 17/063; H03K 17/0822; H03K 17/102; H03K 2217/0063; H03K 2217/0081; H03K 17/567; H02M 1/32; H02M 3/07; B60R 16/03
See application file for complete search history.

(56) References Cited

U.S. PATENT DOCUMENTS 5,510,747 A * 4/1996 Williams ............ H01L 29/1087
327/434
5,572,417 A * 11/1996 Vinciarelli ............ H02M 3/158
323/222

(Continued)

OTHER PUBLICATIONS

Application Note 2012: http://www.maximintegrated.com/support, "MOSFET Driver Is Reverse-Battery Protected", Jun. 20, 2003, pp. 1-2.

(Continued)

*Primary Examiner* — Matthew V Nguyen
(74) *Attorney, Agent, or Firm* — Christopher P. Maiorana, PC

(57) ABSTRACT

An apparatus comprises one or more metal-oxide-semiconductor field effect transistors, a charge pump, and a driver circuit. The one or more metal-oxide-semiconductor field effect transistors are generally connected in series between a supply voltage and an output terminal. The charge pump may be configured to generate a voltage of sufficient magnitude relative to the supply voltage to switch the one or more metal-oxide-semiconductor field effect transistors into a conductive state. The driver circuit is generally coupled between the charge pump and the one or more metal-oxide-semiconductor field effect transistors. The driver circuit may be configured to drive the one or more metal-oxide-semiconductor field effect transistors to provide at least one of power switching, reverse polarity protection, power switching with reverse polarity protection, or over voltage inhibition.

18 Claims, 10 Drawing Sheets

(56) References Cited

U.S. PATENT DOCUMENTS

| | | | |
|---|---|---|---|
| 7,102,416 B2* | 9/2006 | Finney | H02M 3/07 |
| | | | 327/112 |
| 7,265,603 B2 | 9/2007 | Lee et al. | 327/427 |
| 8,183,715 B2 | 5/2012 | Hanawa et al. | 307/86 |
| 9,774,322 B1* | 9/2017 | Duduman | H03K 17/223 |
| 2003/0142518 A1* | 7/2003 | Cheng | H03K 17/063 |
| | | | 363/59 |
| 2004/0150927 A1* | 8/2004 | Strayer | H02H 11/003 |
| | | | 361/82 |
| 2013/0257521 A1* | 10/2013 | Syed | H02M 3/07 |
| | | | 327/536 |
| 2014/0307352 A1* | 10/2014 | Zhou | H02H 3/20 |
| | | | 361/18 |

OTHER PUBLICATIONS

Maxim Integrated, "High-Side, n-Channel MOSFET Switch Driver", 19-1176; Rev. 3, May 2015 (May 2015), pp. 1-9.

* cited by examiner

UNLOCKABLE SWITCH INHIBITOR

FIELD OF THE INVENTION

The invention relates to power control and reverse voltage protection generally and, more particularly, to a method and/or apparatus for implementing an unlockable switch inhibitor.

BACKGROUND

Electric or electronic circuits can need one or more of power supply polarity inversion protection, voltage peak protection, or control via an external command signal. For example, metal-oxide-semiconductor field effect transistor (MOSFET) power-switch drivers need to be protected against a reversed battery connection. A conventional method is to use a small rectifier diode between the battery and the driver circuit. However, if a device being protected (or controlled) consumes a sufficient current, a non-satisfactory power loss through one or more rectifier diodes may be experienced. For example, a one ampere load current generates a power loss of 0.7 to 1.2 watts through a rectifier diode, due to the forward voltage drop of the diode and the current through the diode. Such a loss is not negligible in battery powered high-current devices. Especially since power loss increases with load current. For example, a load current of 10 amperes could result in a power loss of about 7 to 12 watts.

It would be desirable to implement an unlockable switch inhibitor.

SUMMARY

The invention concerns an apparatus comprising one or more metal-oxide-semiconductor field effect transistors, a charge pump, and a driver circuit. The one or more metal-oxide-semiconductor field effect transistors are generally connected in series between a supply voltage and an output terminal. The charge pump may be configured to generate a voltage of sufficient magnitude relative to the supply voltage to switch the one or more metal-oxide-semiconductor field effect transistors into a conductive state. The driver circuit is generally coupled between the charge pump and the one or more metal-oxide-semiconductor field effect transistors. The driver circuit may be configured to drive the one or more metal-oxide-semiconductor field effect transistors to provide at least one of power switching, reverse polarity protection, power switching with reverse polarity protection, or over voltage inhibition.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing an unlockable switch inhibitor that may (i) provide a low loss alternative to power diodes, (ii) protect circuits from over voltage, (iii) protect circuits from reverse voltage, (iv) provide a switchable power diode replacement, (v) protect electrical and electronic circuits from premature power-up, (vi) block a power system from changing from a desired passing or non-passing state unless the change is deliberately provoked (e.g., via a command signal), and/or (vi) be implemented as one or more integrated circuits.

Due to the forward voltage drop of a conventional anti-reverse battery rectifier diode, a 1 ampere current running through the diode may result in a power loss of 0.7 to 1.2 watts. The power loss generally increases as current increases. In automotive applications, many high-current accessories (e.g., heated steering wheel, tactile feedback actuator, heated seats, window defroster, mirror defroster, etc.) are in demand. Power losses from protecting such accessories are no longer negligible. For a current of 10 amperes the power loss could be about 7 to 12 watts. An unlockable switch inhibitor (USI) in accordance with an example embodiment of the invention may still have a power loss of about 0.7 watt, albeit at a much higher current than conventional rectifier diodes (e.g., 14 amperes in a rectifier mode using one MOSFET or 10 amperes with a control option using two MOSFETs). In general, a USI in accordance with an example embodiment of the invention may provide a low power loss alternative to replace conventional power diodes. The USI may also be configured to suppress voltage peaks and be configured to control loads. In some embodiments, a small connection to the vehicle ground (e.g., negative battery terminal) may be implemented for certain types of loads or control.

Figure 1:
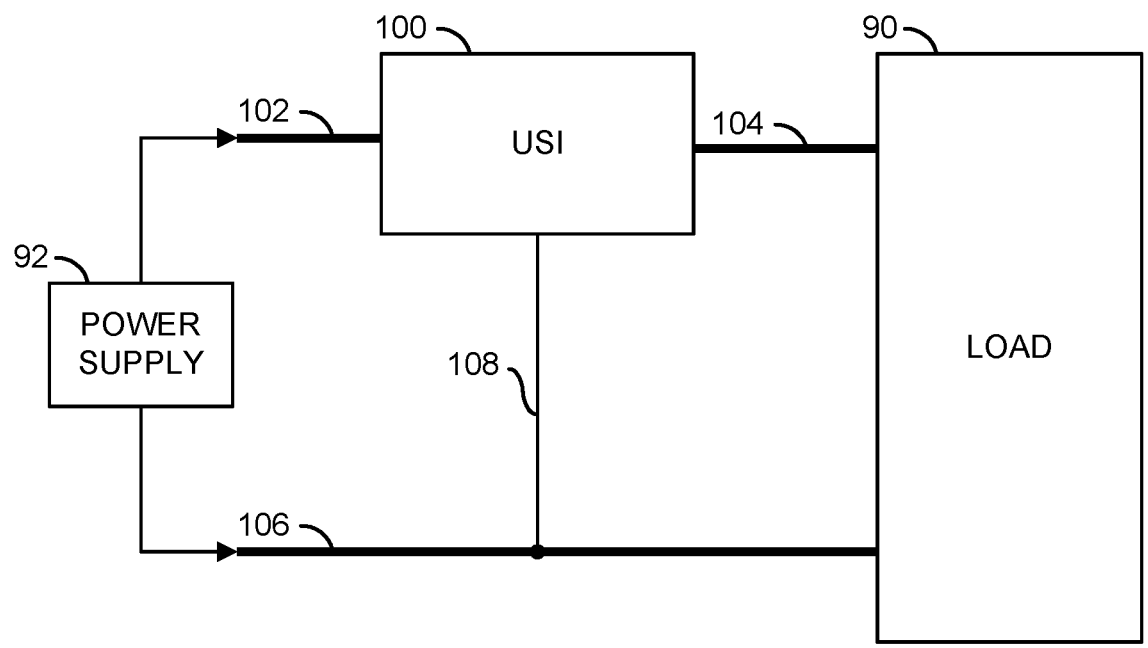
FIG. 1 is a diagram illustrating an example embodiment.

Referring to FIG. 1, a diagram of a module 100 is shown illustrating application of an unlockable switch inhibitor (USI) in accordance with an example embodiment of the invention. In an example, the module (or circuit) 100 may implement an unlockable switch inhibitor (USI) in accordance with an example embodiment of the invention. In an example, the circuit 100 may be configured to couple a load 90 to a power supply 92. In various applications, the load 90 may comprise a high current automotive accessory (e.g., heated steering wheel, heated seat, window defroster, mirror defroster, vibration generating device for providing tactile feedback and/or driver warning, etc.). The power supply 92 is generally implemented as a vehicle power source (e.g., battery, generator, alternator, etc.). In various embodiments, the circuit 100 may be configured to provide at least one of controlled power switching (e.g., using an external control signal), reverse polarity protection, controlled power switching with reverse polarity protection, and/or over voltage inhibition. The circuit 100 generally has a power loss that is significantly lower than conventional rectifier diodes. The circuit 100 may be used in place of a conventional rectifier diode. In various embodiments, the circuit 100 may protect electronic loads from power supply polarity inversion, power supply over voltage, and/or premature power-up.

In various embodiments, an input of the circuit 100 is connected to a first terminal (e.g., positive terminal or supply voltage) of the power supply 92 by a large gauge wire 102 and an output of the circuit 100 is connect to a first terminal of the load 90 by another large gauge wire 104. A second terminal of the load 90 is connected to a second terminal (e.g., negative terminal or ground potential) of the power supply 92, directly or via a vehicle chassis, by yet another large gauge wire 106. In an example, the second terminal of the load 90 may connect to the second terminal of the power supply through a connection to the chassis of the vehicle (e.g., a chassis ground). In an example, the wires 102, 104, and 106 may comprise 16 AWG (American Wire Gauge) or larger diameter wires. In general, the size (diameter) of the wires 102, 104, and 106 may be chosen based on balancing current needs of the load and minimizing vehicle weight and material costs.

Figure 2:
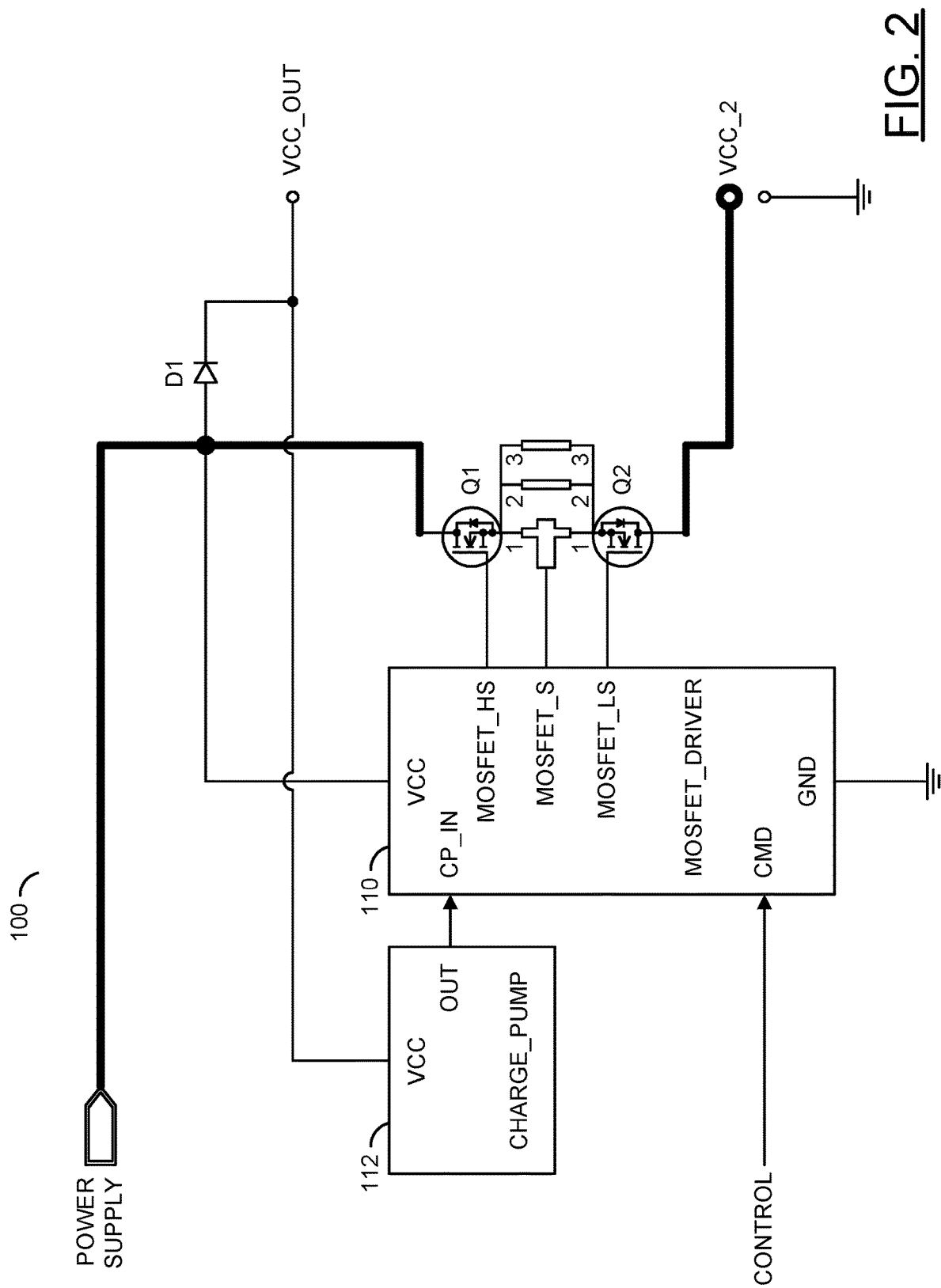
FIG. 2 is a block diagram illustrating an unlockable switch inhibitor (USI) in accordance with an example embodiment of the invention.

In some embodiments, the circuit 100 may have a third terminal that may be connected, directly or via the chassis, to the second terminal of the power supply by a smaller (e.g., 22 AWG, etc.) gauge wire 108. The third terminal may be implemented to provide a ground point for the circuit 100. The third terminal may be omitted when a load controlled by the circuit 100 can withstand some small variations and/or pass a small current when power is not being supplied. In embodiments omitting the third terminal, the load would need to be small enough (e.g., less than a few Kohms) to pass a small current (e.g., a base current of a bipolar transistor and/or a charge pump current) used by the circuit 100 for operation. In some embodiments, the circuit 100 may have a fourth terminal configured to receive a control (or command) signal. In an example, the circuit 100 may be configured to switch between a current passing state and a current blocking state based upon a state of the control signal and/or a polarity of the power supply. Referring to FIG. 2, a diagram illustrating an example implementation of an unlockable switch inhibitor (USI) in accordance with an example embodiment of the invention is shown. In various embodiments, the circuit 100 may comprise one or more metal-oxide-semiconductor field effect transistors (MOSFETs) Q1 and Q2, a circuit 110, and a circuit 112. The circuit 110 may implement a driver circuit. The circuit 112 may implement a charge pump. In an example, the MOSFETs Q1 and Q2 may be implemented as N channel transistors. In another example, the MOSFETs Q1 and Q2 may be implemented as P channel transistors. In various embodiments, the transistors Q1 and Q2 may be implemented with N channel or P channel, enhancement mode or depletion mode transistors depending upon the design criteria of the particular application (e.g., desired state, type of load, type of command signal, etc.). The one or more MOSFETs Q1 and Q2 are generally connected in series between a supply voltage (e.g., POWER SUPPLY) and the output terminal of the circuit 100. An output voltage (e.g., VCC_2) may be presented at the output terminal of the circuit 100. The charge pump 112 may be configured to generate a voltage of sufficient magnitude relative to the supply voltage to switch the one or more MOSFETs Q1 and/or Q2 into a conductive state. For example, the charge pump 112 may be configured to provide a gate source voltage (Vgs) greater than zero (Vgs>0) for N channel MOSFETs and a gate source voltage less than zero (Vgs<0) when P channel MOSFETs are used.

In various embodiments, the driver circuit 110 is generally coupled between the charge pump 112 and the one or more metal-oxide-semiconductor field effect transistors Q1 and Q2. The driver circuit 110 may be configured to drive the one or more metal-oxide-semiconductor field effect transistors Q1 and Q2 to provide at least one of controlled power switching, reverse polarity protection, controlled power switching with reverse polarity protection, and/or over voltage inhibition. In various embodiments, the controlled power switching aspect may be responsive to a control (or command) signal (e.g., CONTROL). In various embodiments, the circuit 110 may be configured to drive a single MOSFET or two MOSFETs connected in series to meet the design criteria of a particular application.

In an example, the supply voltage POWER SUPPLY may be presented to a supply voltage input (e.g., VCC) of the circuit 110 and a drain terminal of the MOSFET Q1. A supply voltage input (e.g., VCC) of the circuit 112 may receive a second supply voltage (e.g., VCC_OUT) generated from the supply voltage POWER SUPPLY through a low power diode D1. In an example, the voltage VCC_OUT may be distributed to various low power electronic devices of a vehicle. An output of the charge pump 112 may be presented to an input (e.g., CP_IN) of the circuit 110. In embodiments utilizing a control signal (e.g., CONTROL) to switch between passing and non-passing states, the signal CONTROL may be presented to a control input (e.g., CMD) of the driver circuit 110. A ground terminal (e.g., GND) of the circuit 110 may be connected to a ground potential (e.g., a chassis ground of the vehicle).

The circuit 110 may have a first output, a second output, and a third output. The first output may present a signal MOSFET_HS. The second output may present a signal MOSFET_S. The third output may present a signal MOSFET_LS. The signal MOSFET_HS may be presented to a gate terminal of the MOSFET Q1. The signal MOSFET_S may be presented to a node formed by connecting a source terminal of the MOSFET Q1 and a source terminal of the MOSFET Q2. The signal MOSFET_LS may be presented to a gate terminal of the MOSFET Q2. A drain terminal of the MOSFET Q2 may be connected to the output terminal of the circuit 100. The drain terminal of the MOSFET Q2 may present the output voltage VCC_2. The circuit 110 is generally configured to generate one or more of the signals MOSFET_HS, MOSFET_S, and MOSFET_LS in response to the supply voltage POWER SUPPLY, the charge pump voltage presented at the input CP_IN, the control signal CONTROL presented at the input CMD, and the ground potential.

The drains of the transistors Q1 and Q2 are generally connected to the power supply input POWER SUPPLY and the output VCC_2, respectively, using large gauge (e.g., 16 AWG or larger diameter) wires. The gauge of the wires connected to the drains of the transistors Q1 and Q2 is generally selected to minimize a voltage drop due to resistance of the wires. The interconnections between the circuit 110, the circuit 112, and the MOSFETs Q1 and Q2 are generally made with small gauge (e.g., 22 AWG or smaller) wires due to the respective currents being small (or quasi non-existent). The connections between the sources (and other related terminals) of the MOSFETs Q1 and Q2 are generally made using traces or conductors providing a current carrying capability substantially equivalent to the current carrying capability of the wires connected to the drains of the MOSFETs Q1 and Q2.

Figure 3:
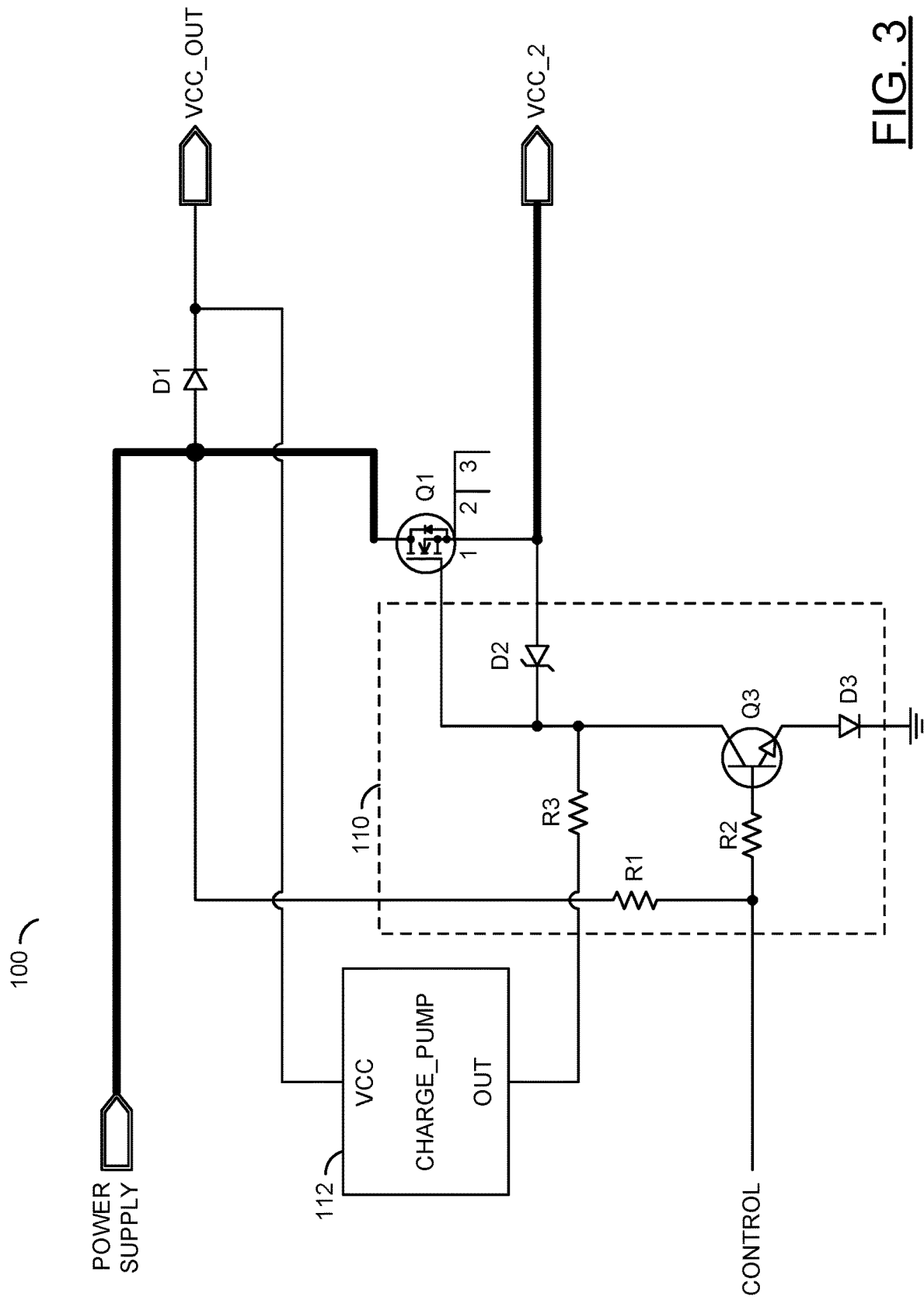
FIG. 3 is a diagram illustrating an example implementation of a controlled unlockable switch inhibitor in accordance with an example embodiment of the invention.

Referring to FIG. 3, a diagram of the circuit 100 is shown illustrating an example implementation of a controlled unlockable switch inhibitor in accordance with an example embodiment of the invention. In an example embodiment, the circuit 100 may be implemented with just the MOSFET Q1. In an example, the circuit 110 may be implemented comprising a bipolar junction transistor Q3, a Zener diode D2, a diode D3, and three resistors R1, R2, and R3. The Zener diode D2 is generally included to limit the gate source voltage (Vgs) of the MOSFET Q1. When the Vgs of the MOSFET does not need to be limited, the Zener diode D2 may be omitted. The bipolar junction transistor Q3 may be implemented as an NPN transistor. However, in other embodiments the bipolar junction transistor Q3 may be implemented as a PNP transistor to meet the design criteria of a particular application.

The supply voltage POWER SUPPLY may be presented to a first terminal of the resistor R1 and the drain terminal of the MOSFET Q1. A second terminal of the resistor R1 and a first terminal of the resistor R2 may be connected to form a node at which the signal CONTROL may be presented. A second terminal of the resistor R2 may be connected to a base terminal of the bipolar transistor Q3. A collector terminal of the bipolar transistor Q3 may be connected to a first terminal of the resistor R3, a cathode terminal of the Zener diode D2, and the gate terminal of the MOSFET Q1. An anode terminal of the Zener diode D2 and the source terminal of the MOSFET Q1 may be connected together and present the supply voltage VCC_2 to the output terminal of the circuit 100. A second terminal of the resistor R3 may be connected to the output of the charge pump 112. An emitter terminal of the bipolar transistor Q3 may be connected to an anode terminal of the diode D3. A cathode terminal of the diode D3 may be connected to the ground potential (e.g., chassis ground).

In an example, the resistor R3 ensures the charge pump 112 presents an output impedance adjusted to be shorted by the bipolar transistor Q3. As soon as a low but sufficient voltage is present with the supply voltage POWER SUPPLY, the bipolar transistor Q3 turns ON shorting the second terminal of the resistor R3 and the gate terminal of MOSFET Q1 to ground via the diode D3. The output voltage of the charge pump 112 is dropped across the resistor R3. The only way to supply the output voltage VCC_2 is to pull the signal CONTROL to the ground potential, turning the bipolar transistor Q3 OFF. In an example, the signal CONTROL may be pulled to the ground potential by an external circuit supplied with the supply voltage VCC_OUT. Although this embodiment allows controlled switching of the supply voltage VCC_2, this embodiment does not prevent the passage of a reverse current due to reversed polarity of the supply voltage POWER SUPPLY.

Figure 4:
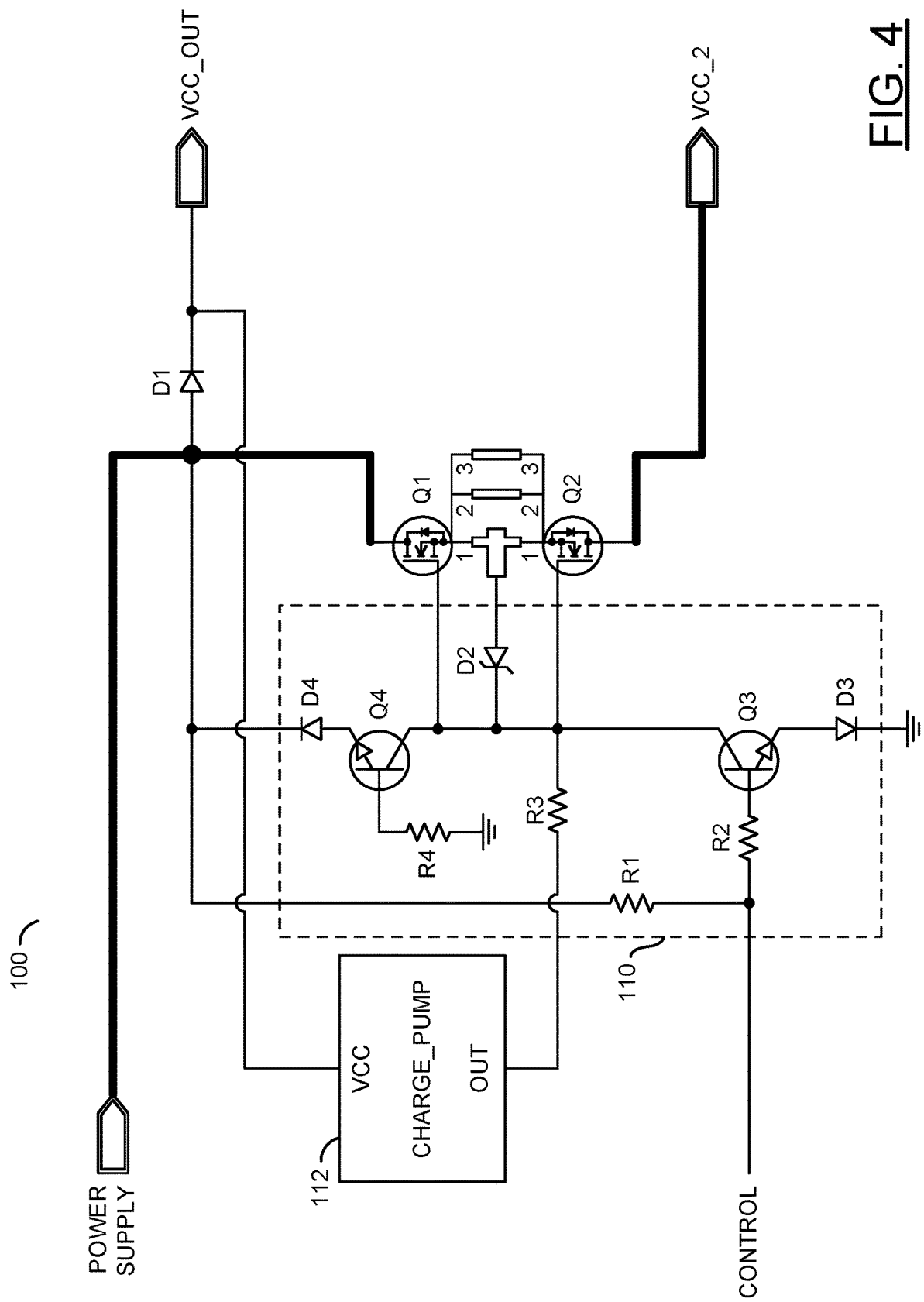
FIG. 4 is a diagram illustrating a controlled unlockable switch inhibitor with anti-reverse polarity capability in accordance with an example embodiment of the invention.

Referring to FIG. 4, a diagram of the circuit 100 is shown illustrating an example implementation of a controlled unlockable switch inhibitor with anti-reverse polarity capability in accordance with an example embodiment of the invention. In an example embodiment, the circuit 100 may be implemented with both of the MOSFETs Q1 and Q2. The circuit 110 may be implemented comprising the bipolar junction transistor Q3, a bipolar transistor Q4, the Zener diode D2, the diode D3, a diode D4, and four resistors R1, R2, R3, and R4. The Zener diode D2 is generally included to limit the gate source voltage (Vgs) of the MOSFET Q1. When the Vgs of the MOSFET does not need to be limited, the Zener diode D2 may be omitted. The bipolar junction transistors Q3 and Q4 may be implemented as NPN transistors. However, in other embodiments the bipolar junction transistors Q3 and Q4 may be implemented as PNP transistors to meet the design criteria of a particular application.

The supply voltage POWER SUPPLY may be presented to a first terminal of the resistor R1, a cathode terminal of the diode D4, and the drain terminal of the MOSFET Q1. The second terminal of the resistor R1 and the first terminal of the resistor R2 may be connected to form the node at which the signal CONTROL may be presented. The second terminal of the resistor R2 may be connected to the base terminal of the bipolar transistor Q3. The collector terminal of the bipolar transistor Q3 may be connected to the first terminal of the resistor R3, the cathode terminal of the Zener diode D2, the gate terminal of the MOSFET Q1, the gate terminal of the MOSFET Q2, and a collector terminal of the bipolar transistor Q4. The anode terminal of the Zener diode D2 and the source terminals of the MOSFETs Q1 and Q2 may be connected together (e.g., by a number of conductive traces configured to provide a high current capability). The drain terminal of the MOSFET Q2 may be connected to present the supply voltage VCC_2 at the output of the circuit 100. The second terminal of the resistor R3 may be connected to the output of the charge pump 112. The emitter terminal of the bipolar transistor Q3 may be connected to the anode terminal of the diode D3. The cathode terminal of the diode D3 may be connected to the ground potential (e.g., the chassis ground). An emitter terminal of the bipolar transistor Q4 may be connected to an anode terminal of the diode D4. A base terminal of the bipolar transistor Q4 may be connected to a first terminal of the resistor R4. A second terminal of the resistor R4 may be connected to the ground potential.

In an example, the resistor R3 ensures the charge pump 112 presents an output impedance adjusted to be shorted either by the bipolar transistor Q3 or by the bipolar transistor Q4. When the supply voltage POWER SUPPLY is positive relative to the ground potential, the bipolar transistor Q4 does not conduct, but the bipolar transistor Q3 turns ON shorting the second terminal of the resistor R3 and the gate charges of the MOSFETs Q1 and Q2 to ground via the diode D3. Eventually, the signal CONTROL may be received from an external electronic circuit powered by the supply voltage VCC_OUT. In an example, the signal CONTROL may be provide by an open collector of the external circuit. When the signal CONTROL is about 0V, the output voltage VCC_2 is powered because the gate voltage of the MOSFETs Q1 and Q2 goes up to the charge pump voltage. The gate-source voltage (Vgs) is generally limited by the Zener diode D2. When the gate-source voltage (Vgs) of the MOSFETs Q1 and Q2 does not need to be limited, the zener diode D2 may be omitted.

When the potential of the supply voltage POWER SUPPLY is negative relative to the ground potential, the bipolar transistor Q3 does not conduct, but the bipolar transistor Q4 conducts the gate charges from the MOSFETs Q1 and Q2 to the power supply potential POWER SUPPLY through the diode D4. With the gate terminals tied to the power supply potential POWER SUPPLY (really the ground) through the diode D4, the MOSFETs Q1 and Q2 do not conduct the current. In general, the embodiment shown in FIG. 4 may protect a load connected to the output VCC_2 of the circuit 100 from a reverse current due to a reversed polarity of the supply voltage POWER SUPPLY.

Figure 5:
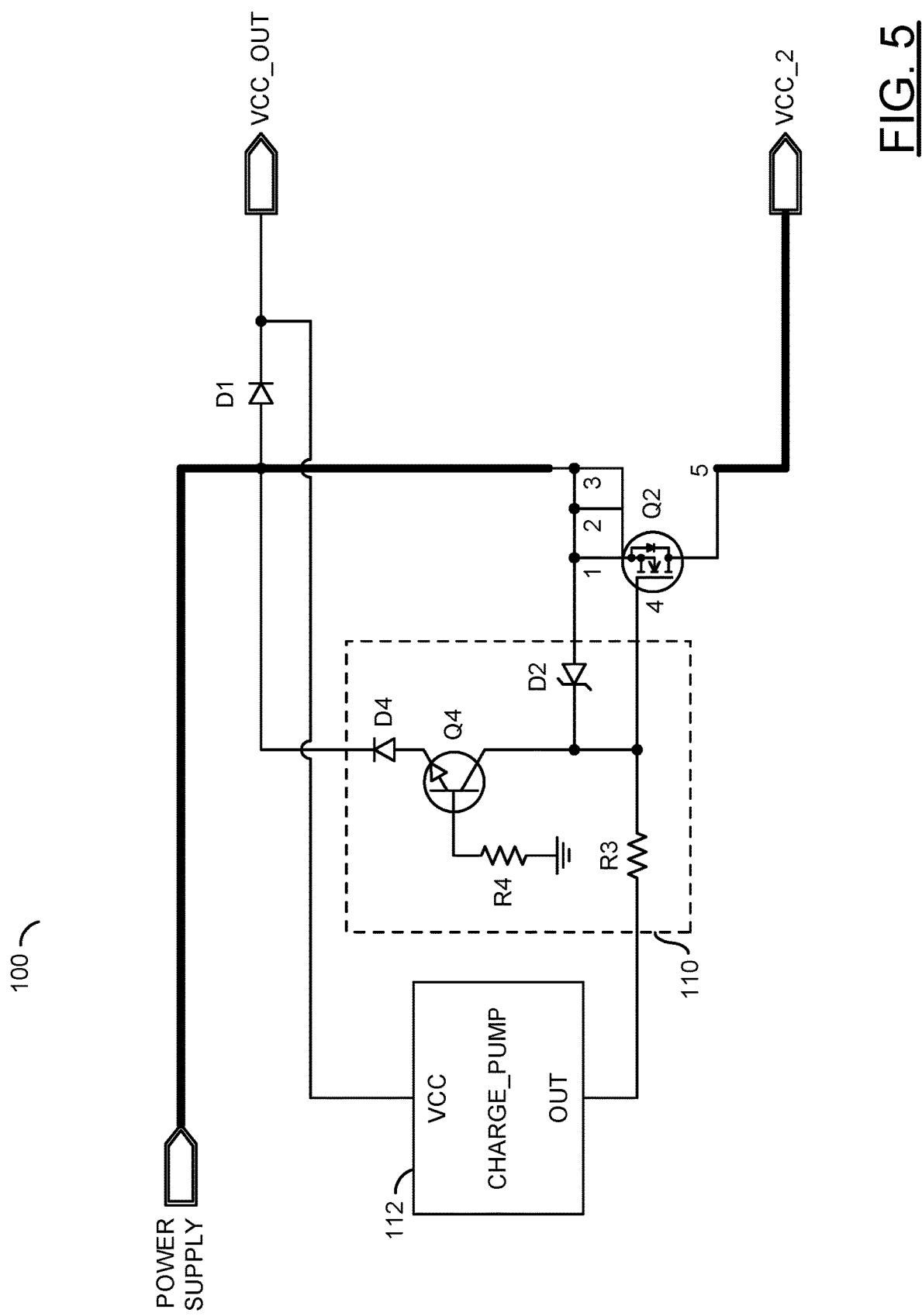
FIG. 5 is a diagram illustrating an example implementation of an unlockable switch inhibitor with anti-reverse polarity capability in accordance with an example embodiment of the invention.

Referring to FIG. 5, a diagram of the circuit 100 is shown illustrating an example implementation of an unlockable switch inhibitor with anti-reverse polarity capability in accordance with an example embodiment of the invention. In an example embodiment providing anti reverse polarity capability with a single MOSFET, the circuit 100 may be implemented with just the MOSFET Q2. The circuit 110 may be implemented comprising the bipolar junction transistor Q4, the Zener diode D2, the diode D4, and the resistors R3 and R4. The Zener diode D2 is generally included to limit the gate source voltage (Vgs) of the MOSFET Q1. When the Vgs of the MOSFET does not need to be limited, the Zener diode D2 may be omitted. In an example, the bipolar junction transistor Q4 may be implemented as an NPN transistor. However, in other embodiments the bipolar junction transistor Q4 may be implemented as a PNP transistor to meet the design criteria of a particular application.

The supply voltage POWER SUPPLY may be presented to the cathode terminal of the diode D4, the anode terminal of the Zener diode D2, and the source terminal of the MOSFET Q2 (e.g., by a number of traces configured to provide a high current capability). The first terminal of the resistor R3 may be connected to the cathode terminal of the Zener diode D2, the gate terminal of the MOSFET Q2, and the collector terminal of the bipolar transistor Q4. The drain terminal of the MOSFET Q2 may be connected to present the supply voltage VCC_2 at the output of the circuit 100. The second terminal of the resistor R3 may be connected to the output of the charge pump 112. The emitter terminal of the bipolar transistor Q4 may be connected to the anode terminal of the diode D4. The base terminal of the bipolar transistor Q4 may be connected to the first terminal of the resistor R4. A second terminal of the resistor R4 may be connected to the ground potential.

When just the anti-reverse function is desired, the lower portion of the circuit 110 shown in FIG. 4 is not necessary. The supply voltage VCC_2 is powered if the supply voltage potential POWER SUPPLY is positive relative to the ground potential. The charge pump is configured to correctly polarize the MOSFET Q2. In general, the embodiment shown in FIG. 5 may protect a load connected to the output VCC_2 of the circuit 100 from a reverse current due to a reversed polarity of the supply voltage POWER SUPPLY.

Figure 6:
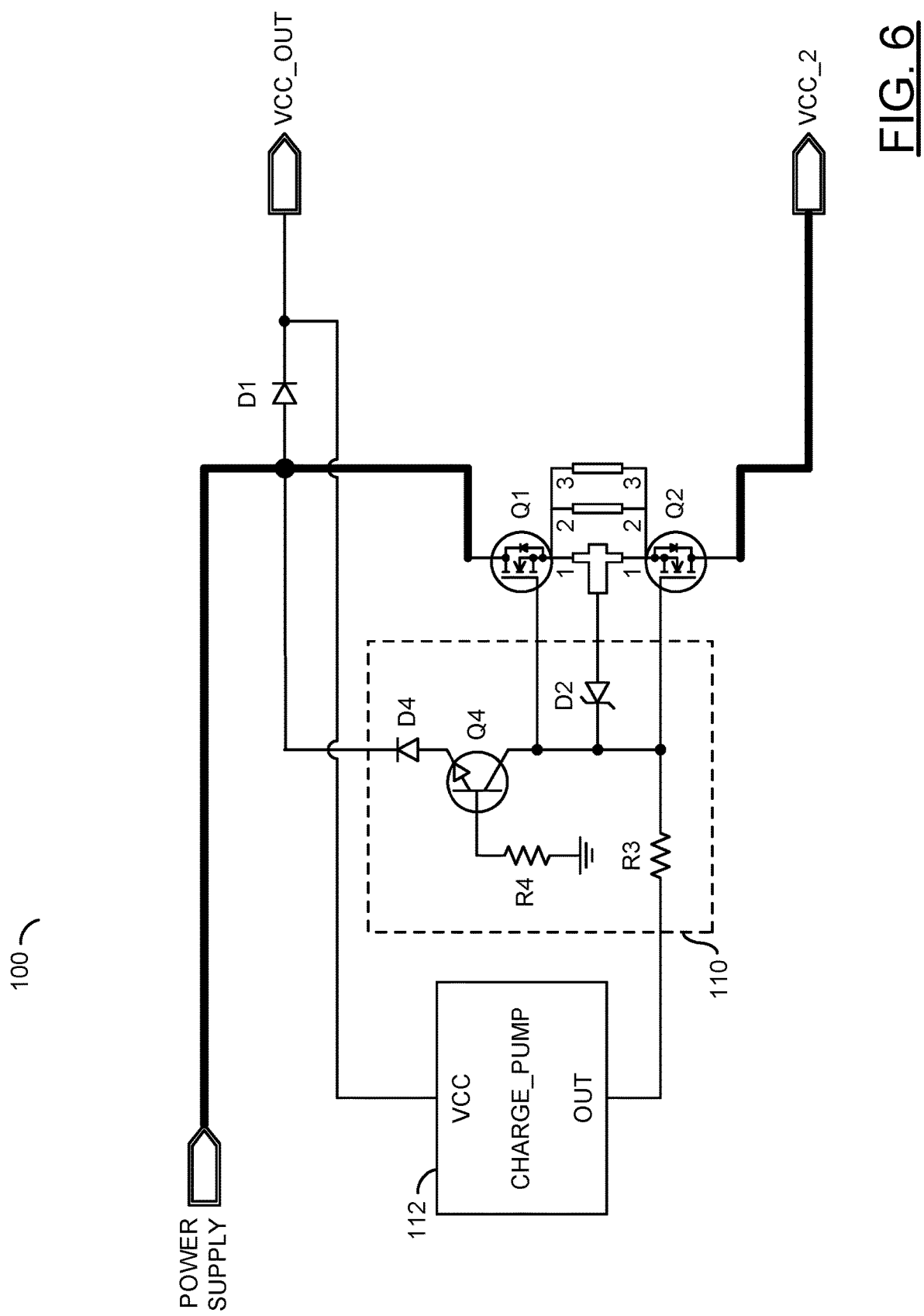
FIG. 6 is a diagram illustrating another example implementation of an unlockable switch inhibitor with anti-reverse polarity capability in accordance with an example embodiment of the invention.

Referring to FIG. 6, a diagram of the circuit 100 is shown illustrating another example implementation of an unlockable switch inhibitor with anti-reverse polarity capability in accordance with an example embodiment of the invention. In another example embodiment, the anti-reverse polarity capability may be provided with two MOSFETs. In an example, the circuit 100 may be implemented with both the MOSFET Q1 and the MOSFET Q2. The circuit 110 may be implemented comprising the bipolar junction transistor Q4, the Zener diode D2, the diode D4, and the resistors R3 and R4. The Zener diode D2 is generally included to limit the gate source voltage (Vgs) of the MOSFET Q1. When the Vgs of the MOSFET does not need to be limited, the Zener diode D2 may be omitted. In an example, the bipolar junction transistor Q4 may be implemented as an NPN transistor. However, in other embodiments the bipolar junction transistor Q4 may be implemented as a PNP transistor to meet the design criteria of a particular application.

The supply voltage POWER SUPPLY may be presented to the cathode terminal of the diode D4 and the drain terminal of the MOSFET Q1. The first terminal of the resistor R3 may be connected to the cathode terminal of the Zener diode D2, the gate terminals of the MOSFETs Q1 and Q2, and the collector terminal of the bipolar transistor Q4. The anode terminal of the Zener diode D2 and the source terminals of the MOSFETs Q1 and Q2 may be connected together (e.g., by a number of traces configured to provide a high current capability). The drain terminal of the MOSFET Q2 may be connected to present the supply voltage VCC_2 at the output of the circuit 100. The second terminal of the resistor R3 may be connected to the output of the charge pump 112. The emitter terminal of the bipolar transistor Q4 may be connected to the anode terminal of the diode D4. The base terminal of the bipolar transistor Q4 may be connected to the first terminal of the resistor R4. The second terminal of the resistor R4 may be connected to the ground potential.

In the MOSFET Q1, nothing prevents the passage of current when the polarity of the supply voltage POWER SUPPLY is correct. The current passes through the MOSFET body diode before the charge pump 112 is able to correctly polarize the MOSFET. The charge pump 112 is needed to correctly polarize the MOSFET Q2.

Figure 7:
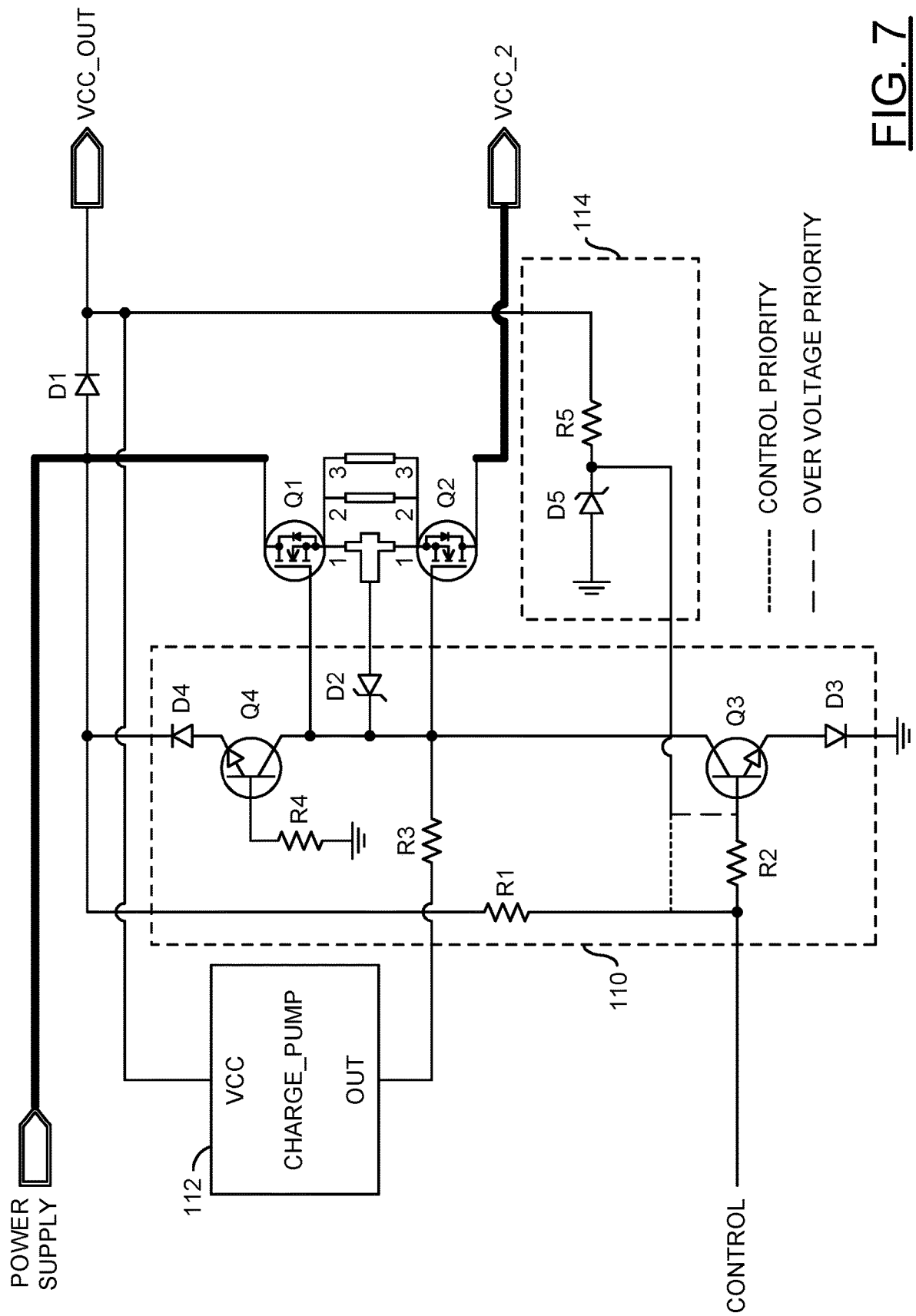
FIG. 7 is a diagram illustrating a controllable unlockable switch inhibitor with anti-reverse and over voltage inhibition capabilities in accordance with an example embodiment of the invention.

Referring to FIG. 7, a diagram of the circuit 100 is shown illustrating a controllable unlockable switch inhibitor with anti-reverse and over voltage inhibition capabilities in accordance with an example embodiment of the invention. In another example embodiment providing over voltage inhibition, the circuit 110 may be implement as described above in connection with FIG. 4, except for addition of a circuit 114. The circuit 114 generally provides a simple over voltage inhibition implemented using a Zener diode and a resistor if a fast power supply voltage slew rate is expected. In an example, the circuit 114 may comprise a Zener diode D5 and a resistor R5. The value of the Zener voltage of the Zener diode D5 sets the over voltage level.

In an example, the supply voltage VCC_OUT may be presented to a first terminal of the resistor R5. A second terminal of the resistor R5 may be connected to a cathode terminal of the Zener diode D5. An anode terminal of the Zener diode D5 may be connected to the ground potential (e.g., chassis ground). The second terminal of the resistor R5 may also be connected to either the base terminal of the bipolar transistor Q3 or to the node formed by the connection of the resistors R1 and R2 at which the signal CONTROL may be presented.

In an example, the connection of the circuit 114 to the circuit 110 may determine whether or not the over voltage protection has priority over the command signal. When the over voltage protection is not to have priority over the command signal, the second terminal of the resistor R5 may be connected to the node at which the signal COMMAND may be presented (e.g., illustrated by a dotted line). When the over voltage protection is to have priority over the command signal, the second terminal of the resistor R5 may be connected to the base terminal of the transistor Q3 (e.g., illustrated by a long dash line). In some embodiments, the connection of the resistor R5 to the circuit 110 may be configured as a jumper option.

Figure 8:
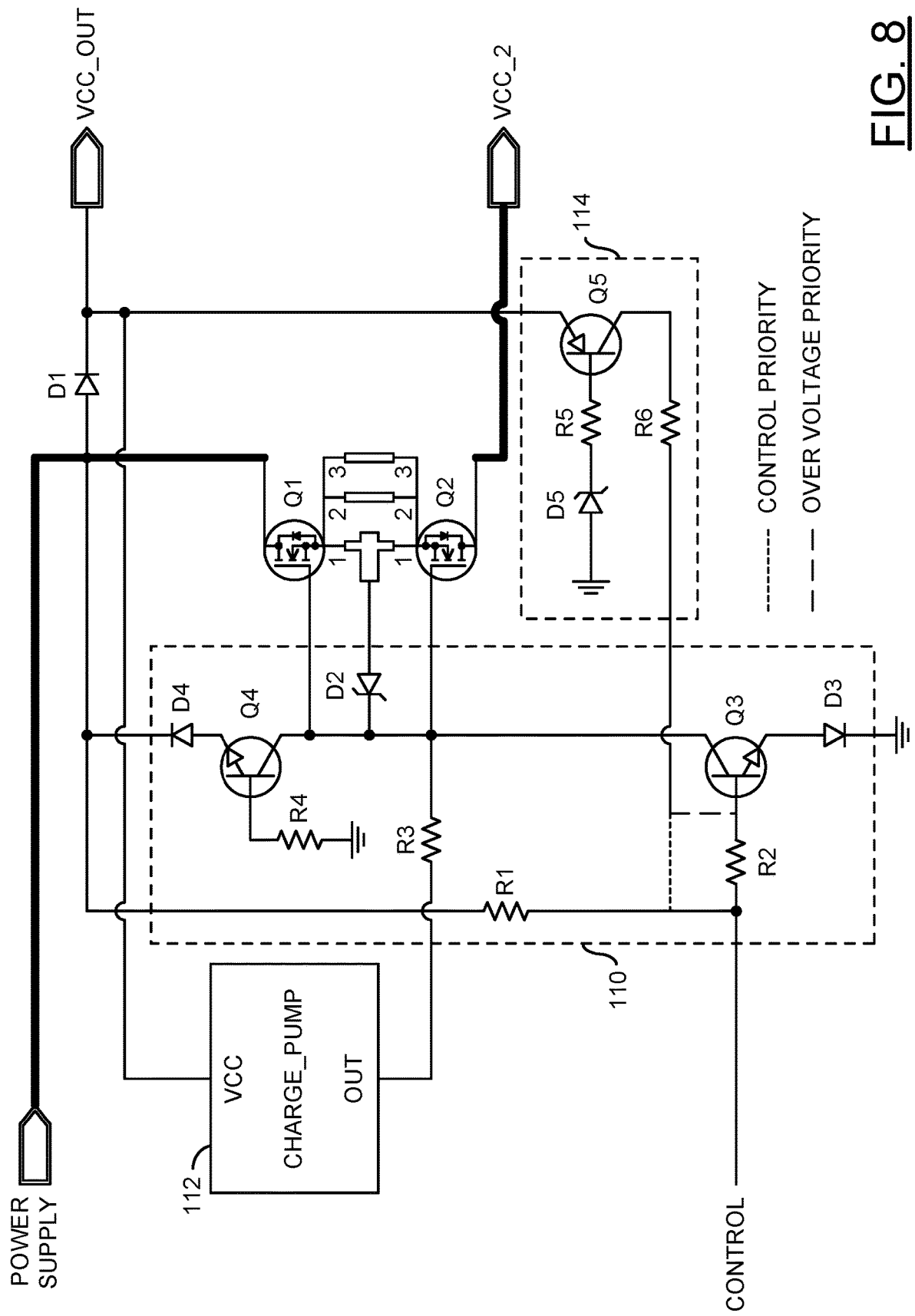
FIG. 8 is a diagram illustrating a controllable unlockable switch inhibitor with anti-reverse with over voltage inhibition capabilities in accordance with another example embodiment of the invention.

Referring to FIG. 8, a diagram of the circuit 100 is shown illustrating a controllable unlockable switch inhibitor with anti-reverse and over voltage inhibition capabilities in accordance with another example embodiment of the invention. In another example embodiment providing over voltage inhibition, the circuit 110 may be implement as described above in connection with FIG. 4, except for addition of a circuit 114. When a slow power supply voltage slew rate is expected, the circuit 114 may be used to provide the over voltage inhibition using one PNP bipolar transistor, a Zener diode, and two resistors. The value of the Zener voltage of the Zener diode D5 sets the over voltage level. In an example, the circuit 114 may comprise the Zener diode D5, the resistor R5, the resister R6, and a bipolar transistor Q5. In an example, the bipolar junction transistor Q5 may be implemented as an PNP transistor. However, in other embodiments the bipolar junction transistor Q5 may be implemented as an NPN transistor to meet the design criteria of a particular application.

In an example, the supply voltage VCC_OUT may be presented to an emitter terminal of the transistor Q5. A base terminal of the transistor Q5 may be connected to a first terminal of the resistor R5. A second terminal of the resistor R5 may be connected to a cathode terminal of the Zener diode D5. An anode terminal of the Zener diode D5 may be connected to the ground potential (e.g., chassis ground). A collector terminal of the transistor Q5 may be connected to a first terminal of the resistor R6. A second terminal of the resistor R6 may be connected to either the base terminal of the bipolar transistor Q3 or to the node formed by the connection of the resistors R1 and R2 at which the signal CONTROL may be presented.

In an example, the connection of the circuit 114 to the circuit 110 may determine whether or not the over voltage protection has priority over the command signal. When the over voltage protection is not to have priority over the command signal, the second terminal of the resistor R6 may be connected to the node at which the signal COMMAND may be presented (e.g., illustrated by a dotted line). When the over voltage protection is to have priority over the command signal, the second terminal of the resistor R6 may be connected to the base terminal of the transistor Q3 (e.g., illustrated by a long dash line). In some embodiments, the connection of the resistor R6 to the circuit 110 may be configured as a jumper option.

Figure 9:
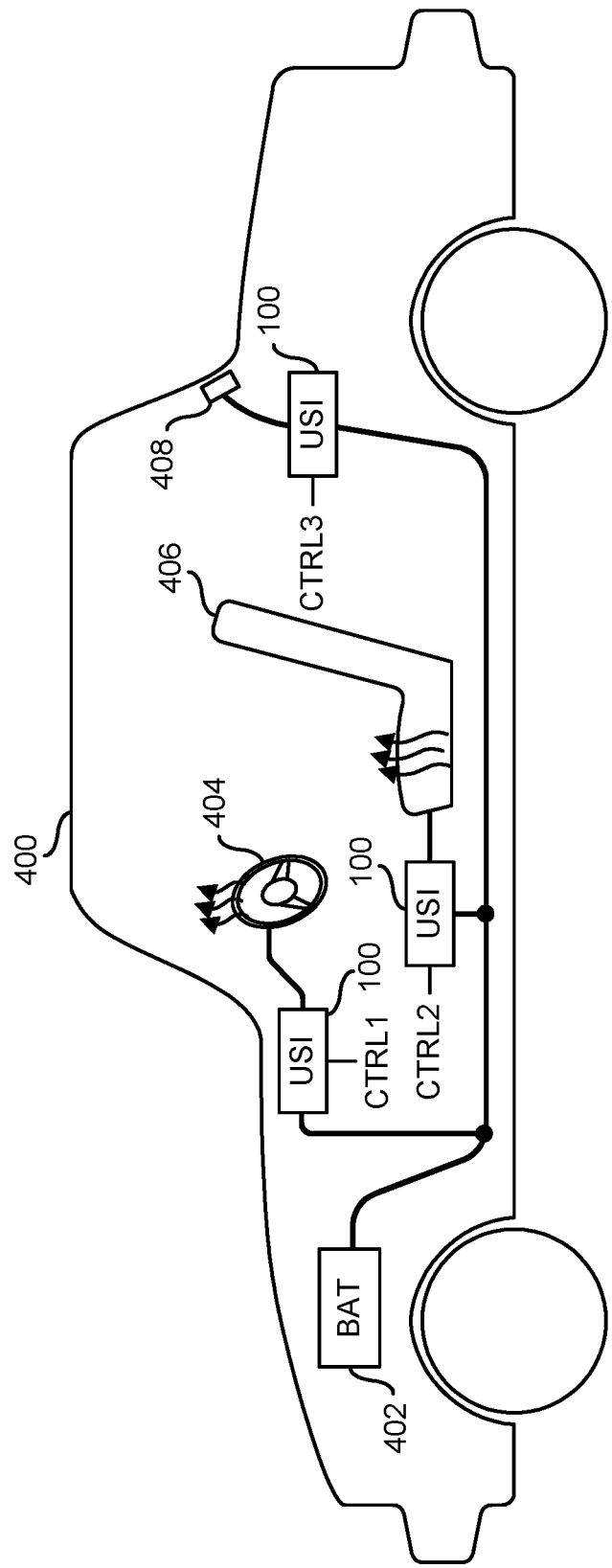
FIG. 9 is a diagram illustrating a context in which an unlockable switch inhibitor in accordance with an example embodiment of the invention may be implemented.

Referring to FIG. 9, a diagram of a vehicle 100 is shown illustrating a context in which an unlockable switch inhibitor circuit in accordance with an example embodiment of the invention may be implemented. In an example, the circuit 100 implementing an unlockable switch inhibitor in accordance with example embodiments of the invention may be used to connect and/or control accessories in the vehicle 400. In an example, the vehicle 400 may include a battery 402 and a number of loads including, but not limited to a heated steering wheel 404, heated seats 406, and a rear window defroster 408. The battery 402 may be connected to each of the loads 404-408 by a respective module (or circuit) 100. The circuits 100 may be configured to provide at least one of controlled power switching (e.g., using an external control signal), reverse polarity protection, controlled power switching with reverse polarity protection, and/or over voltage inhibition. Each of the circuits 100 generally has a power loss that is significantly lower than a conventional rectifier diode. In an example, each of the loads 404-408 of the vehicle 400 may be controlled by a respective one of a number of control signals (e.g., CTRL1, CTRL2, CTRL3, etc.) presented to the associated circuit 100.

Figure 10:
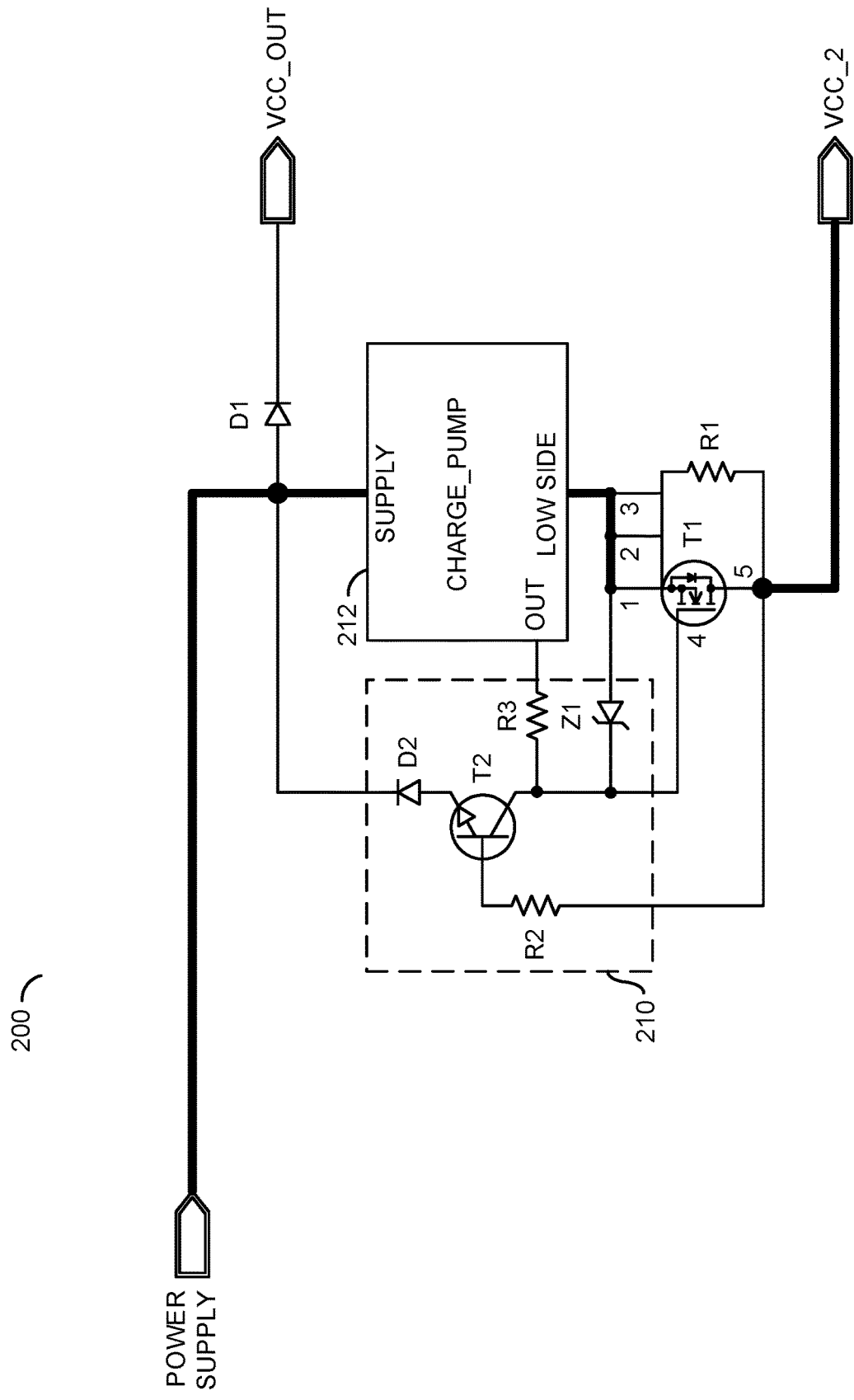
FIG. 10 is a diagram illustrating an example implementation of an anti-reverse polarity capability in accordance with an alternative embodiment of the invention.

Referring to FIG. 10, a diagram of a circuit 200 is shown illustrating an example implementation of an anti-reverse polarity capability in accordance with an alternative embodiment of the invention. In applications where a load can withstand some small current when essentially turned OFF and/or some small current variations when turned ON, a series type charge pump may be configured to generate a voltage higher than the supply voltage without using a ground point. In an anti-reverse polarity application, a driver circuit in accordance with an alternative embodiment of the invention may be connected to the VCC_2 potential instead of the ground potential.

In an example embodiment providing anti-reverse polarity capability with a single MOSFET, the circuit 200 may comprise a metal-oxide-semiconductor field effect transistor (MOSFET) T1, a resistor R1, a circuit 210, and a circuit 212. The circuit 210 may implement a driver circuit. The circuit 212 may implement a series type charge pump. In an example, the MOSFET T1 may be implemented as an N channel transistor. In another example, the MOSFET T1 may be implemented as a P channel transistor. In various embodiments, the transistor T1 may be implemented with an N channel or P channel, enhancement mode or depletion mode transistor depending upon the design criteria of the particular application (e.g., desired state, type of load, type of command signal, etc.). The resistor R1 may comprise a low power resistor. The resistor R1 may be connected between a source terminal and a drain terminal of the MOSFET T1.

The supply voltage POWER SUPPLY may be presented to an input (e.g., SUPPLY) of the circuit 212 and an anode terminal a low power diode D1. A second supply voltage (e.g., VCC_OUT) generated from the supply voltage POWER SUPPLY through the low power diode D1 may be distributed to various low power electronic devices of a vehicle. In an example, the circuit 210 may comprise a bipolar junction transistor T2, a Zener diode Z1, a diode D2, a resistor R2, and a resistor R3. The bipolar junction transistor T2 may be implemented as an NPN transistor. However, in other embodiments the bipolar junction transistor T2 may be implemented as a PNP transistor to meet the design criteria of a particular application.

In an example, an emitter terminal of the bipolar junction transistor T2 may be connected to an anode terminal of the diode D2. A cathode terminal of the diode D2 may be connected to the supply voltage POWER SUPPLY. A base terminal of the bipolar junction transistor T2 may be connected to a first terminal of the resistor R2. A second terminal of the resistor R2 may be connected to a drain terminal of the MOSFET T1. A collector terminal of the bipolar junction transistor T2 may be connected to a first terminal of the resistor R3, a cathode terminal of the Zener diode Z1, and a gate terminal of MOSFET T1. An anode terminal of the Zener diode Z1 may be connected to a source terminal of the MOSFET T1. A second terminal of the resistor R3 may be connected to a first output (e.g., OUT) of the circuit 212. The output OUT of the circuit 212 may be configured to present a voltage of sufficient magnitude relative to the supply voltage to switch the MOSFET T1 into a conductive state. A second output (e.g., LOW SIDE) of the circuit 212 may be connected to the anode terminal of the Zener diode Z1, and the source terminal of the MOSFET T1 (e.g., by a number of traces configured to provide a high current capability). The drain terminal of the MOSFET T1 may be connected to present the supply voltage VCC_2 at an output of the circuit 200.

When the supply is connected with the correct polarity the circuit 210 generally does nothing. When the supply is connected with reverse polarity, the MOSFET T1 is turned OFF by the circuit 210, but the small base current from the bipolar junction transistor T2 may pass through the load. The load controlled by the circuit 200 needs to be able to withstand some small variations and/or pass a small current when power is not being supplied. The load would need to be small enough (e.g., less than a few Kohms) to pass a small current (e.g., the base current of the bipolar junction transistor T2 and/or the current of charge pump 212) used by the circuit 200 for operation. The low power resistor R1 generally provides a path to supply the charge pump 212 when the power is OFF. In the configuration illustrated in FIG. 10, the small current variation of the charge pump 212 may be on the order of a few milliamperes.

In various embodiments, not only an alternative to power diodes but also a protection system from over voltage and the possibility to control the "alternative power diode" are provide. An unlockable switch inhibitor in accordance with example embodiments of the invention may be used with all types of electric or electronic circuits that need one or more of: polarity inversion protection (e.g., if the device consume a current sufficient to generate a non-desirable power loss through one or a few rectifier diode); over voltage or voltage spike protection; and/or simple control by an external command signal. In general, the unlockable switch inhibitor in accordance with embodiments of the invention may provide an anti-reverse circuit that prevents the passage of a current if the power supply voltage polarity is not correct; over voltage inhibition that prevents the passage of a current if the power supply voltage is higher than a chosen threshold, thereby preventing a voltage spike; an unlockable switch that waits for an electrical (control) signal to allow the passage of a current.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
one or more metal-oxide-semiconductor field effect transistors connected in series between a supply voltage and an output terminal;
a charge pump configured to generate a voltage of sufficient magnitude relative to the supply voltage to switch the one or more metal-oxide-semiconductor field effect transistors into a conductive state; and
a driver circuit coupled between the charge pump and the one or more metal-oxide-semiconductor field effect transistors, wherein
the driver circuit (i) comprises at least one bipolar junction transistor having a collector terminal connected to a gate terminal of the one or more metal-oxide-semiconductor field effect transistors and an emitter terminal connected via a diode to either said supply voltage or a ground potential, and (ii) is configured to drive the one or more metal-oxide-semiconductor field effect transistors to provide at least one of power switching, reverse polarity protection, power switching with reverse polarity protection, or over voltage inhibition.

2. The apparatus according to claim 1, wherein:
the one or more metal-oxide-semiconductor field effect transistors comprise N channel transistors; and
the charge pump is configured to generate a voltage more positive than the supply voltage.

3. The apparatus according to claim 1, wherein:
the one or more metal-oxide-semiconductor field effect transistors comprise P channel transistors; and
the charge pump is configured to generate a voltage more negative than a ground potential.

4. The apparatus according to claim 1, wherein:
the one or more metal-oxide-semiconductor field effect transistors comprise enhancement mode transistors.

5. The apparatus according to claim 1, wherein:
the one or more metal-oxide-semiconductor field effect transistors comprise depletion mode transistors.

6. The apparatus according to claim 1, wherein the apparatus drives a load connected between the output terminal and the ground potential.

7. The apparatus according to claim 6, wherein the load comprises at least one of a heated steering wheel, a heated seat, a window defroster, a mirror defroster, a vibration generating device providing tactile feedback, a vibration generating device providing a driver warning, or other high current automotive accessory.

8. The apparatus according to claim 1, wherein the driver circuit is further configured to control the one or more metal-oxide-semiconductor field effect transistors in response to a control signal.

9. The apparatus according to claim 1, further comprising an over voltage inhibition circuit coupled to said driver circuit.

10. The apparatus according to claim 9, wherein said over voltage inhibition circuit comprises a Zener diode and a resistor.

11. The apparatus according to claim 10, wherein said over voltage inhibition circuit further comprises a second resistor and a bipolar junction transistor.

12. The apparatus according to claim 9, wherein said over voltage inhibition circuit is configured to determine whether over voltage inhibition has priority.

13. The apparatus according to claim 1, wherein:
said at least one bipolar junction transistor is configured to couple the gate terminal of the one or more metal-oxide-semiconductor field effect transistors to the supply voltage in a reverse polarity condition.

14. The apparatus according to claim 1, wherein:
said at least one bipolar junction transistor is configured to couple the gate terminal of the one or more metal-oxide-semiconductor field effect transistors to the ground potential in response to a first state of a control signal and allow the gate terminal of the one or more metal-oxide-semiconductor field effect transistors to be biased by the charge pump in response to a second state of the control signal.

15. The apparatus according to claim 1, wherein the driver circuit comprises:
a first bipolar junction transistor;
a second bipolar junction transistor;
a first diode;
a second diode;
a first resistor;
a second resistor; and
a third resistor, wherein
the supply voltage is presented to a first terminal of the first resistor and a cathode terminal of the first diode, a second terminal of the first resistor and a first terminal of the second resistor are connected to form a node at which a control signal can be presented, a second terminal of the second resistor is connected to a base terminal of the first bipolar junction transistor, an emitter terminal of the first bipolar junction transistor is connected to an anode terminal of the second diode and a cathode terminal of the second diode is connected to the ground potential, an emitter terminal of the second bipolar junction transistor is connected to an anode terminal of the first diode, a base terminal of the second bipolar junction transistor is connected to a first terminal of the third resistor, and a second terminal of the third resistor is connected to the ground potential.

16. The apparatus according to claim 15, wherein the driver circuit further comprises a Zener diode connected between a source terminal of the one or more metal-oxide-semiconductor field effect transistors and a node formed by connection of the collector terminal of the first bipolar junction transistor, the collector terminal of the second bipolar junction transistor, and the gate terminal of the one or more metal-oxide-semiconductor field effect transistors, said Zener diode configured to limit a source-gate voltage of the one or more metal-oxide-semiconductor field effect transistors.

17. A method of providing a low power loss reverse polarity protection comprising:

coupling one or more metal-oxide-semiconductor field effect transistors in series between a supply voltage and a load connected to a ground potential;

generating a control voltage of sufficient magnitude relative to the supply voltage to switch the one or more metal-oxide-semiconductor field effect transistors into a conductive state; and using one or more bipolar junction transistors to control application of the control voltage to gate terminals of the one or more metal-oxide-semiconductor field effect transistors to provide at least one of power switching, reverse polarity protection, power switching with reverse polarity protection, or over voltage inhibition for the load, wherein each of the one or more bipolar junction transistors has (i) a collector terminal connected to the gate terminals of the one or more metal-oxide-semiconductor field effect transistors and (ii) an emitter terminal connected via a diode to either the supply voltage or the ground potential.

18. An automotive electronic control module comprising:

at least one metal-oxide-semiconductor field effect transistor connected between a supply voltage and an output terminal;

a charge pump connected to said supply voltage and configured to generate a voltage of sufficient magnitude relative to the supply voltage to switch the at least one metal-oxide-semiconductor field effect transistor into a conductive state; and a driver circuit coupled between the charge pump and the at least one metal-oxide-semiconductor field effect transistor, wherein the driver circuit (i) comprises at least one bipolar junction transistor having a collector terminal connected to a gate terminal of the at least one metal-oxide-semiconductor field effect transistor and an emitter terminal connected via a diode to either said supply voltage or a ground potential, and (ii) is configured to drive the at least one metal-oxide-semiconductor field effect transistor to provide one or more of power switching, reverse polarity protection, power switching with reverse polarity protection, or over voltage inhibition.

\* \* \* \* \*